(12) United States Patent
Selvamanickam et al.

(10) Patent No.: US 7,879,763 B2
(45) Date of Patent: Feb. 1, 2011

(54) SUPERCONDUCTING ARTICLE AND METHOD OF MAKING

(75) Inventors: Venkat Selvamanickam, Wynantskill, NY (US); Yunfei Qiao, Schenectady, NY (US)

(73) Assignee: Superpower, Inc., Schenectady, NY (US)

( * ) Notice: Subject to any disclaimer, the term of this patent is extended or adjusted under 35 U.S.C. 154(b) by 1077 days.

(21) Appl. No.: 11/558,518

(22) Filed: Nov. 10, 2006

(65) Prior Publication Data

US 2008/0113869 A1    May 15, 2008

(51) Int. Cl.
*H01B 12/00* (2006.01)

(52) U.S. Cl. .................. 505/239; 505/238; 428/930

(58) Field of Classification Search .............. 505/238, 505/239; 428/930
See application file for complete search history.

(56) References Cited

U.S. PATENT DOCUMENTS

| | | | |
|---|---|---|---|
| 5,372,089 A * | 12/1994 | Yoshida et al. .......... | 117/98 |
| 5,739,086 A | 4/1998 | Goyal et al. | |
| 5,741,377 A | 4/1998 | Goyal et al. | |
| 5,820,707 A | 10/1998 | Amick et al. | |
| 5,898,020 A | 4/1999 | Goyal et al. | |
| 5,958,599 A | 9/1999 | Goyal et al. | |
| 5,964,966 A | 10/1999 | Goyal et al. | |
| 6,106,615 A | 8/2000 | Goyal et al. | |
| 6,190,752 B1 | 2/2001 | Do et al. | |
| 6,265,353 B1 | 7/2001 | Kinder et al. | |
| 6,331,199 B1 | 12/2001 | Goyal et al. | |
| 6,447,714 B1 | 9/2002 | Goyal et al. | |
| 6,537,689 B2 * | 3/2003 | Schoop et al. .......... | 428/701 |
| 6,599,346 B2 | 7/2003 | Goyal et al. | |
| 6,602,313 B2 | 8/2003 | Goyal et al. | |
| 6,607,838 B2 | 8/2003 | Goyal et al. | |
| 6,607,839 B2 | 8/2003 | Goyal et al. | |
| 6,610,413 B2 | 8/2003 | Goyal et al. | |
| 6,610,414 B2 | 8/2003 | Goyal et al. | |
| 6,635,097 B2 | 10/2003 | Goyal et al. | |
| 6,784,139 B1 | 8/2004 | Sankar et al. | |
| 6,790,253 B2 | 9/2004 | Goyal et al. | |
| 6,797,030 B2 | 9/2004 | Goyal et al. | |
| 6,846,344 B2 | 1/2005 | Goyal et al. | |
| 6,890,369 B2 | 5/2005 | Goyal et al. | |
| 6,925,316 B2 | 8/2005 | Rey | |
| 6,956,012 B2 * | 10/2005 | Paranthaman et al. ....... | 505/434 |
| 2004/0206952 A1 * | 10/2004 | Jia et al. .................. | 257/32 |
| 2004/0248743 A1 * | 12/2004 | Norton et al. ............... | 505/237 |
| 2005/0028347 A1 | 2/2005 | Maher | |
| 2005/0172643 A1 | 8/2005 | Lewis | |
| 2005/0220986 A1 | 10/2005 | Selvamanickam et al. | |
| 2006/0073979 A1 | 4/2006 | Thieme et al. | |
| 2006/0186381 A1 | 8/2006 | Selvamanickam et al. | |

* cited by examiner

*Primary Examiner*—Steven Bos
*Assistant Examiner*—Paul A Wartalowicz
(74) *Attorney, Agent, or Firm*—Larson Newman & Abel, LLP (57) ABSTRACT

A superconducting article is provided that includes a substrate, wherein the substrate is untextured and comprises a nickel-based alloy containing primarily nickel and not less than about 20 wt % of an alloying element, and wherein the substrate is essentially free of Mo and Mn. The superconducting article further includes a buffer layer overlying the substrate and a high-temperature superconducting (HTS) layer overlying the buffer layer.

24 Claims, 5 Drawing Sheets

SUPERCONDUCTING ARTICLE AND METHOD OF MAKING

BACKGROUND

1. Field of the Disclosure

The invention relates to superconducting articles and methods of making superconducting articles, more specifically to superconducting articles utilizing particular substrate materials.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters. In addition, other benefits of high-temperature superconductors in the power industry include a factor of 3-10 increase of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Among the various types of second generation HTS tapes, two main technologies have emerged: RABiTs-based and IBAD-based HTS conductors. RABiTs technology relies on use of a biaxially textured substrate, the microstructure of the substrate providing the crystalline template for overlying layers, notably the HTS layer. In contrast, IBAD technology does not utilize a textured substrate; rather IBAD relies upon ion beam assisted deposition (IBAD) to form a biaxially textured buffer layer over the substrate. The deposited biaxially textured buffer layer provides a template for overlying layers, such as the HTS layer.

In the context of IBAD-based HTS tapes, the industry has sought tapes with improved processability through ease in formation of the constituent layers, improved performance, and improved durability.

SUMMARY

According to one aspect a superconducting article is provided that includes a substrate, wherein the substrate is untextured and comprises a nickel-based alloy containing primarily nickel and not less than about 20 wt % of an alloying element, and wherein the substrate is essentially free of Mo and Mn. The superconducting article further includes a buffer layer overlying the substrate and a high-temperature superconducting (HTS) layer overlying the buffer layer.

According to another aspect a superconducting article is provided that includes a substrate, wherein the substrate is untextured and can be amorphous, or polycrystalline comprising grains having a random orientation. The substrate also includes a nickel-based alloy containing primarily nickel and not less than about 20 wt % of an alloying element selected from the group of elements consisting of W, Cr, and V. The substrate is also essentially free of Mo and Mn. The article further includes a buffer layer overlying the substrate, such that the buffer layer includes at least one biaxially textured film having biaxially aligned crystals both in-plane and out-of plane of the film, and a high-temperature superconducting (HTS) layer overlying the buffer layer.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

Figure 1:
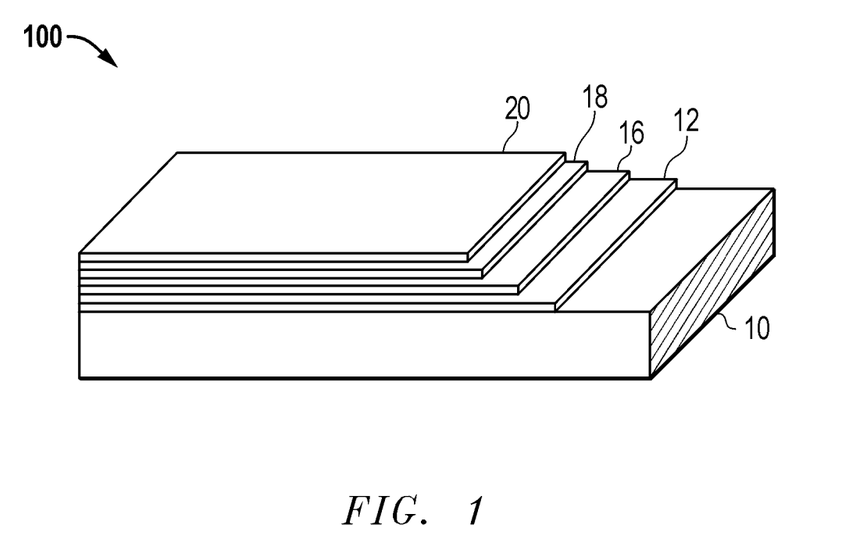
FIG. 1 illustrates a perspective view showing the generalized structure of a superconducting article according to an embodiment.

Turning to FIG. 1, a general layered structure of a superconducting article is depicted for illustrative purposes. The superconducting article includes a substrate 10, a buffer layer 12 overlying the substrate 10, and a superconducting layer 16. Optionally, the superconducting article can also include a capping layer 18 over the superconducting layer, which typically includes a noble metal layer. The superconducting article can optionally include a stabilizer layer 20, which typically includes a non-noble metal.

According to one embodiment, the formation of a superconducting article includes providing a substrate 10. The substrate 10 is generally metal-based, and typically, an alloy of at least two metallic elements having a desirable creep, chemical and mechanical properties, including coefficient of expansion, tensile strength, yield strength, and elongation. For example, Inconel® metal alloys or Hastelloy® metal alloys exhibits such properties. Metals such as these are generally commercially available in the form of spooled tapes, particularly suitable for superconductor tape fabrication, which typically will utilize reel-to-reel tape handling. However, according to embodiments provided below, further description of particular alloys for use as the substrate is provided.

According to one embodiment, the substrate 10 is in a tape-like configuration, having a high dimension ratio. For example, the width of the tape is generally on the order of about 0.4-10 cm, and the length of the tape is typically at least about 100 m, most typically greater than about 500 m. Embodiments provide for superconducting tapes that include a substrate 10 having a length on the order of 1 km or above. Accordingly, the substrate can have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

Furthermore, the substrate can be treated so as to have desirable surface properties for subsequent deposition of the constituent layers of the superconductor tape. For example, the surface may be lightly polished to a desired flatness and surface roughness, after which the surface is also typically cleaned followed by annealing and ion-treatment. Such techniques are described more fully in U.S. Ser. No. 10/816,045, filed Apr. 1, 2004 incorporated herein by reference.

Turning to the buffer layer 12, the buffer layer may be a single layer, or more commonly, be made up of several films. Most typically, the buffer layer includes at least one biaxially textured film, having a crystalline texture that is generally aligned along crystal axes both in-plane and out-of-plane of the film. As is understood in the art, biaxial texturing may be accomplished by IBAD. IBAD is an acronym that stands for ion beam assisted deposition, a technique that may be advantageously utilized to form a suitably textured buffer film for subsequent formation of a superconductor layer having desirable crystallographic orientation for superior superconducting properties. Generally, the biaxially textured IBAD film has a rock-salt like crystal structure, as defined and described in U.S. Pat. No. 6,190,752, incorporated herein by reference, and further described below in accordance with the embodiments.

The superconducting layer 16 is generally in the form of a high-temperature superconducting (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconducting layer 16 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger deposition zone. Typically, the superconducting layer 16 has a thickness on the order of about 1 to about 30 microns, most typically about 2 to about 20 microns, such as about 2 to about 10 microns, in order to get desirable amperage ratings associated with the superconductor layer 16.

The capping layer 18 and the stabilizer layer 20 are generally implemented to provide a low resistance interface and for electrical stabilization to aid in prevention of superconductor burnout in practical use. More particularly, layers 18 and 20 aid in continued flow of electrical charges along the superconductor in cases where cooling fails or the critical current density is exceeded, and the superconductor layer moves from the superconducting state and becomes resistive. Typically, a noble metal is utilized for capping layer 18 to prevent unwanted interaction between the stabilizer layer(s) and the superconductor layer 16. Typical noble metals include gold, silver, platinum, and palladium. Silver is typically used due to its cost and general accessibility. The capping layer 18 is typically made to be thick enough to prevent unwanted diffusion of the components from the stabilizer layer 20 into the superconductor layer 16, but is made to be generally thin for cost reasons (raw material and processing costs). Typical thicknesses of the capping layer 18 range within about 0.1 to about 10.0 microns, such as 0.5 to about 5.0 microns. Various techniques may be used for deposition of the capping layer 18, including physical vapor deposition, such as DC magnetron sputtering.

The stabilizer layer 20 is generally incorporated to overlie the superconducting layer 16, and in particular, overlie and directly contact the capping layer 18 in the particular embodiment shown in FIG. 1. The stabilizer layer 20 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating. In this regard, the capping layer 16 may function as a seed layer for deposition of copper thereon.

Figure 2:
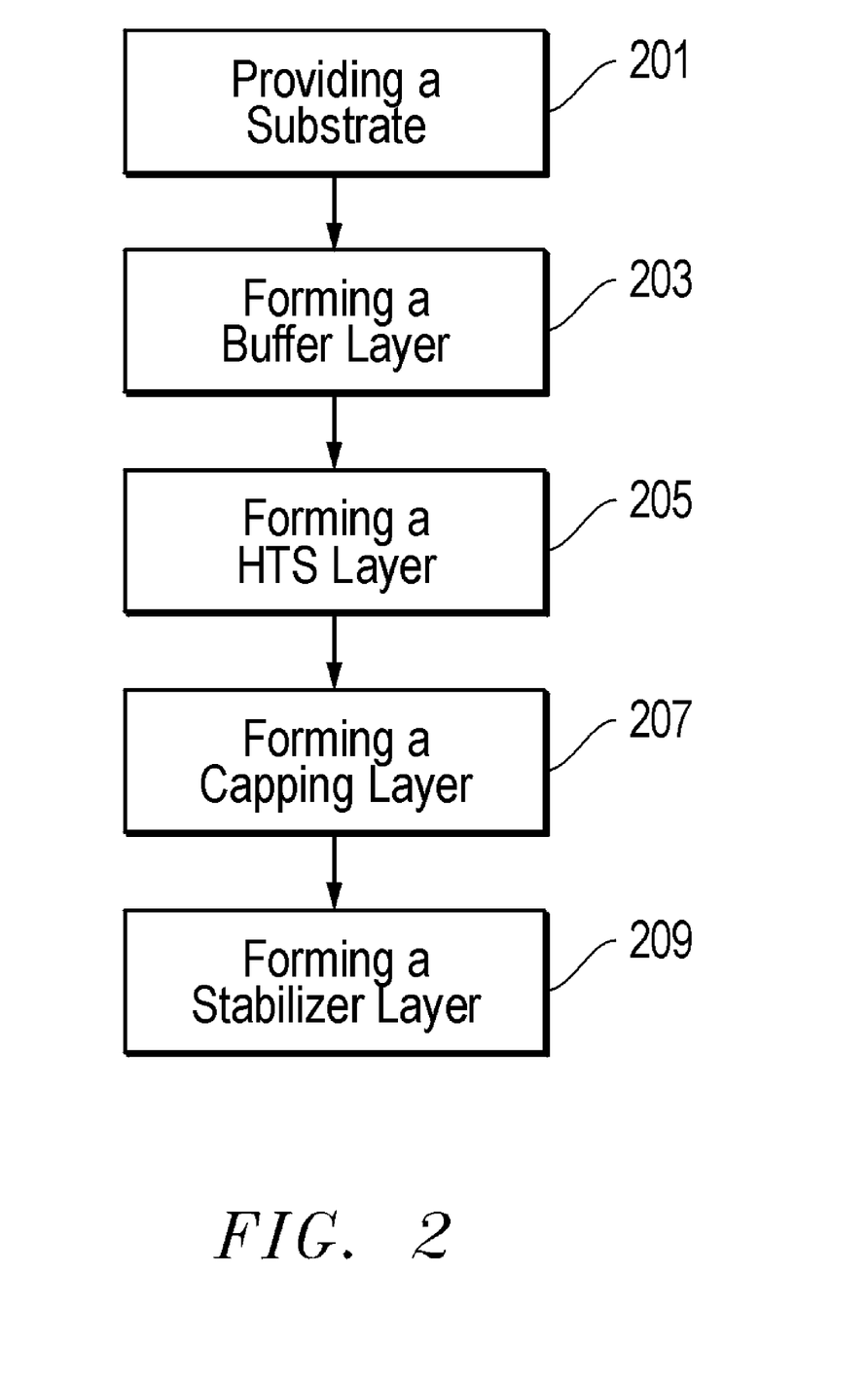
FIG. 2 illustrates a flow chart of a process of forming a superconducting article according to one embodiment.

Referring to FIG. 2, a flow chart is provided illustrating a process of forming a superconducting article according to one embodiment. As illustrated, a substrate is first provided 201. Generally, the substrate is made primarily of nickel, such that the majority of the material of the substrate is nickel. In one embodiment, the substrate is not less than about 50 wt % nickel, such as not less than about 60 wt % nickel. Typically, the substrate contains not greater than about 80 wt % nickel, such as not greater than about 75 wt % nickel. In a particular embodiment, the substrate has an amount of nickel within a range of between about 50 wt % and about 80 wt %.

While the substrate consists primarily of nickel, the remaining material generally includes an alloying element. Accordingly, in one embodiment, the alloying element is present in an amount of not less than about 20 wt %, such as not less than about 25 wt %, or even not less than about 30 wt %. In a particular embodiment, the alloying element is present in an amount of between about 20 wt % and 40 wt %.

The alloying element is generally a transition metal, such as a Group VIB or Group VB transition metal element. According to one embodiment, the alloying element is a Group VB, in particularly can be a transition metal element including W, V, or Cr.

In regards to the composition of the substrate, the substrate material is essentially free of certain elements, particularly Mo and Mn, as provided above. As used herein, the substrate composition is considered to be "essentially free" of an element when such element exists in an amount of not greater than about 0.50 wt %, such as not greater than about 0.25 wt %, typically not greater than about 0.05 wt % and most typically not greater than about 1000 ppm. In addition to the particular elements of Mo and Mn, the substrate can be essentially free of other impurity elements, such as Al, Co, Cu, P, Sb, Cd, As, Sn, and Co. According to one embodiment, the substrate is essentially free of these impurity elements such that any one of these elements is present in an amount of not greater than about 0.50 wt %, such as not greater than about 0.25 wt %, or not greater than about 0.05 wt %, typically not greater than about 1000 ppm. Moreover, the substrate is essentially free of impurity elements, such that the total combined amount of all impurity elements is not greater than about 1.0 wt %, such as not greater than about 0.5 wt %, or even not greater than about 0.05 wt %. Moreover, the substrate can be essentially free of all of the impurity elements including Mo and Mn, such that the total combined amount of all these elements is not greater than about 0.50 wt %, such as not greater than about 0.25 wt %.

As indicated in previous embodiments, the substrate tape has a reduced amount of impurities. Additionally, the total number of elements making up the substrate material is reduced. While the substrate contains primarily nickel and an alloying element, other elements may exist. For example, besides nickel and the alloying element, some trace elements such as Fe, Si, or B or a combination thereof can be present in small amounts. According to one particular embodiment, the substrate includes not greater than about 5.0 wt % Fe, such as not greater than about 4.0 wt %, or even not greater than about 2.0 wt % Fe. Still, in one embodiment, the substrate is essentially free of Fe. Other elements, such as Si, or B, can be present in similar amounts, such as not greater than about 5.0 wt %, not greater than about 2.0 wt %, or particularly not greater than about 1.0 wt %. Accordingly, the substrate composition generally includes not greater than about 5 elements. In one embodiment, the substrate includes not greater than about 4 elements, such as not greater than about 3 elements, and in particular, not greater than about 2 elements (apart from minor impurity content), such that the substrate is a binary alloy including Ni and the alloying element.

In further reference to the substrate, the surface of the substrate tape is generally untextured, having no substantial crystalline order. In particular reference to the morphology of the substrate material, according to one embodiment, the substrate can be amorphous, such that it lacks crystalline structure, having no short-range or long-range order. According to another embodiment, the substrate can be polycrystalline, such that the material comprises crystalline grains having short-range order, but lacking long-range order. Accordingly, substrates having a polycrystalline morphology exhibit crystalline grains and grain boundaries, and the grains are randomly oriented such that there is no orientation or texture from grain to grain. The grains generally have an average size of less than about 20 microns, such as less than about 10 microns, or even less than about 5.0 microns. In addition, the lack of texture in the substrate may be quantified by large mosaic spread, generally greater than about 30°, or greater than about 50°, such as 60° or higher.

Provision of a suitable substrate can include providing a substrate of certain physical characteristics able to withstand reel-to-reel processing. Accordingly, the substrate is generally a material having an average modulus of elasticity of not less than about $28 \times 10^6$ psi. More particularly, a higher modulus of elasticity is desirable and in one embodiment, the modulus of elasticity of the substrate material is not less than about $29 \times 10^6$ psi, such as not less than about $30 \times 10^6$ psi. In one particular embodiment, the average modulus of elasticity is not less than about $31 \times 10^6$ psi. The substrate can also include a material having a sufficient yield strength to withstand the rigors of processing. According to one embodiment, the substrate has a yield strength (post an annealing process) of not less than about 30,000 psi, such as not less than about 35,000 psi, or even not less than about 40,000 psi.

In addition to the physical characteristics, the substrate material generally has electrical characteristics suitable for forming a long-length superconducting article. As such, the substrate typically includes a material having an electrical resistivity at room temperature of not less than about 80 microhm cm. In one particular embodiment, the substrate includes a material having an electrical resistivity at room temperature of not less than about 90 microhm cm, or even not less than about 100 microhm cm. It will be appreciated that in addition to suitable electrical characteristics, the substrate material should generally be paramagnetic at operating temperatures of the superconducting article.

Provision of the substrate can include additional processing of the substrate such as polishing and cleaning of the substrate. Generally, before the formation of overlying layers, the substrate is cleaned using liquids ranging from water to other substances such as acid, oxidizers, organic solvents, or a combination thereof. The cleaning step can also include the use of ultrasonic equipment, or electrocleaning equipment. Additionally, the substrate can be subject to a polishing treatment. The polishing step can include electropolishing utilizing electrodes and an electropolishing solution. After cleaning and electropolishing the surface of the substrate is smoothened, generally having a surface roughness ($R_a$) of less than about 0.1 microns, such as less than about 0.05 microns, or still, less than about 0.01 microns.

Referring again to the flow chart of FIG. 2, the process provides that a buffer layer is formed overlying the substrate 203. As discussed above, the buffer layer can include a series of films. According to one embodiment, one of the films is a barrier film, which is generally deposited over the substrate and in direct contact with the substrate to reduce the diffusion of certain species between the substrate and the HTS layer. The barrier film can be deposited using techniques including sputtering, evaporation, and chemical vapor deposition.

Generally, the barrier film can be an untextured layer, exhibiting no crystalline order. Accordingly, the barrier film can have an amorphous morphology, having no long-range order or short-range order. Alternatively, the barrier film can have a polycrystalline morphology, such that it exhibits short-range order in the form of crystalline grains. In such embodiments where the barrier layer comprises polycrystalline morphology having crystalline grains, the grains are randomly oriented, such that there is no long-range order or alignment from grain to grain.

The barrier film is generally an oxide, particularly an oxide compound that is suitable for reducing the diffusion of certain species between the substrate and overlying layers, particularly the HTS layer. The oxide compound can include metal oxide compounds like ceramic materials, such as $Y_2O_3$, $SrRuO_3$, or $Al_2O_3$, or the like. The buffer layer can include a plurality of barrier films. In such embodiments utilizing more than one barrier film, each barrier films can be made of a different material. According to one embodiment, the barrier film is a single layer of one oxide material. Generally the single barrier film has a thickness of not greater than about 0.2 microns, such as not greater than about 0.1 microns, or even not greater than about 0.05 microns.

According to an alternative embodiment, the buffer layer is free of a barrier film. In such embodiments, no untextured barrier film is present and a biaxially textured film is overlying and directly in contact with the surface of the substrate. In such embodiments utilizing a barrier film-free construction, the substrate can have a particular composition, suitably a binary alloy consisting primarily of Ni and not less than about 20 wt % of an alloying element and being particularly free of Mo, Mn and other impurity elements described previously.

As discussed previously, the buffer layer can include a series of films, one of which is a biaxially textured film. Accordingly, the buffer layer generally includes at least one biaxially textured film, typically a plurality of biaxially textured films. In fact, all of the films of the buffer layer can be biaxially textured. The biaxially textured film generally comprises an oxide material, including materials like $Al_2O_3$, $LaMnO_3$, $La_2Zr_2O_7$, $Gd_2Zr_2O_7$, $MgO$, $NiO$, $YSZ$, $CeO_2$, $Y_2O_3$, $Mn_3O_4$, $Fe_3O_4$, $Cu_2O$, and $RE_2O_3$, wherein RE is a rare earth element. One or more of the biaxially textured films can include these materials or a combination thereof. Such film or films may have a tight in-plane mosaic spread, indicating grain-to-grain crystallographic alignment, such as less than about 30°, or less than about 20°, or less than about 15°.

According to one embodiment, the biaxially textured film is deposited using an ion beam assisted deposition (IBAD) technique. In a particular embodiment, the buffer layer comprises at least one film comprised of biaxially aligned crystals, such that the texture is both in-plane and out-of plane of the film. IBAD processing typically requires temperatures below 100° C. As such, according to one particular embodiment, the temperature during IBAD processing of the biaxially textured film is less than about 75° C. In another embodiment, the temperature during IBAD is less than about 50° C., or less than about 25° C.

Referring again to FIG. 2, after forming the buffer layer 203, the high-temperature superconducting layer (HTS) can be formed overlying the buffer layer 205. Forming the HTS layer, as described above, generally includes using a deposition technique, such as chemical vapor deposition or physical vapor deposition processes such as pulsed laser deposition. The HTS layer can include those materials, such as $REBa_2Cu_3O_{7-x}$, wherein RE is a rare earth element, as provided in embodiments above associated with the description of FIG. 1. Additionally, the HTS layer has the same or substantially similar texture as that of the biaxially textured buffer layer.

Referring again to the flow chart of FIG. 2, after forming the HTS layer 205, formation of the superconducting article includes forming a capping layer 207. As described above, the capping layer can be formed using various deposition techniques such as physical vapor deposition, or particularly DC magnetron sputtering. As also described above, the capping layer can include materials such as a noble metal to prevent unwanted interaction between the stabilizer layer(s) (which is formed to overlie the capping layer) and the HTS layer. Typical noble metals include gold, silver, platinum, and palladium.

FIG. 2 also provides that after formation of the capping layer 207, a stabilizer layer can be formed 209 to overlie the capping layer. As mentioned above, formation of the stabilizer layer 209 can generally include any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating.

Beyond the particular architecture and process techniques in connection with superconducting articles such as tapes as described above, embodiments are also directed to components, such as industrial or commercial power components incorporating such conductors. Certain embodiments are drawn to power cables, a class of power components known as "rotating machines," which broadly includes power generators and motors, and other embodiments are drawn to transformers.

Figure 3:
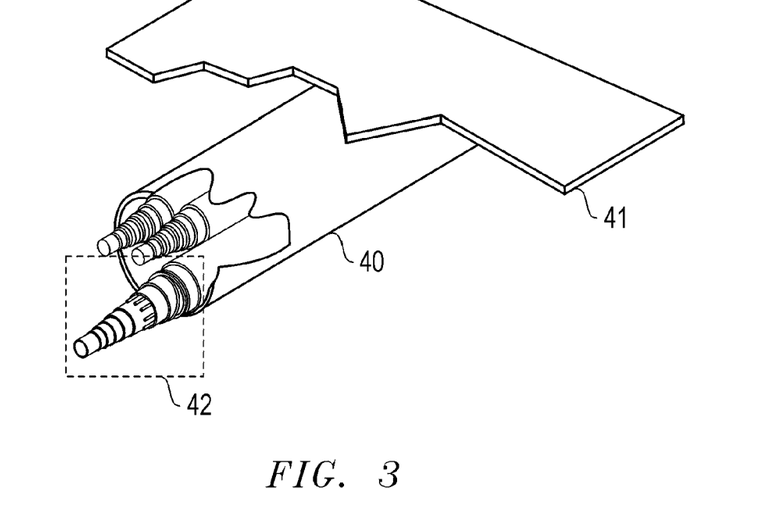
FIG. 3 illustrates a superconducting article as a power cable according to one embodiment.
Figure 4:
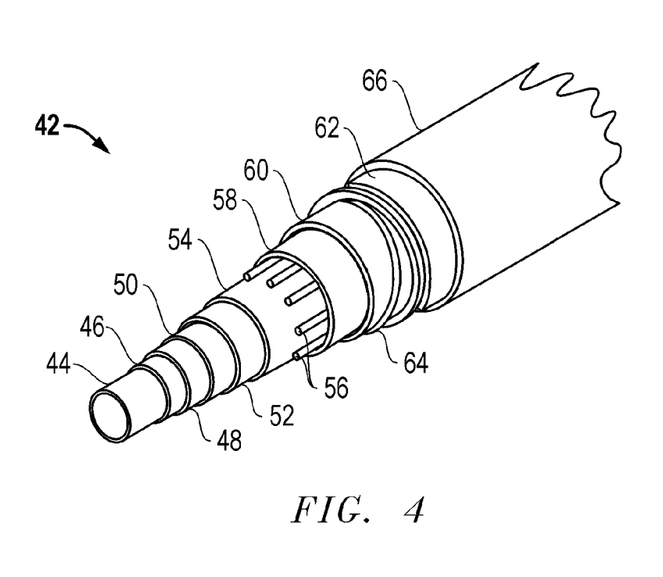
FIG. 4 illustrates a superconducting article as a power cable according to one embodiment.

Turning from particular structures of the superconducting conductors, FIGS. 3 and 4 illustrate implementation of a superconducting conductor in a commercial power component, namely a power cable. FIG. 3 illustrates several power cables 42 extending through an underground conduit 40, which may be a plastic or steel conduit. FIG. 3 also illustrates the ground 41 for clarity. As is shown, several power cables may be run through the conduit 40.

Turning to FIG. 4, a particular structure of a power cable is illustrated. In order to provide cooling to maintain the superconductive power cable in a superconducting state, liquid nitrogen is fed through the power cable through LN2 duct 44. One or a plurality of HTS conductors 46 is/are provided so as to cover the duct 44. While conventional tapes are generally placed onto the duct 44 in a helical manner, the conductors according to embodiments of the present invention need not be helically wound, but, in other embodiments, may extend linearly, parallel to the longitudinal axis of the power cable. Further components include a copper shield 48, a dielectric tape 50 for dielectric separation of the components, a second HTS tape 52, a copper shield 54 having a plurality of centering wires 56, a second, larger LN2 duct 58, thermal insulation 60, provided to aid in maintaining a cryogenic state, a corrugated steel pipe 62 for structural support, including skid wires 64, and an outer enclosure 66.

Figure 5:
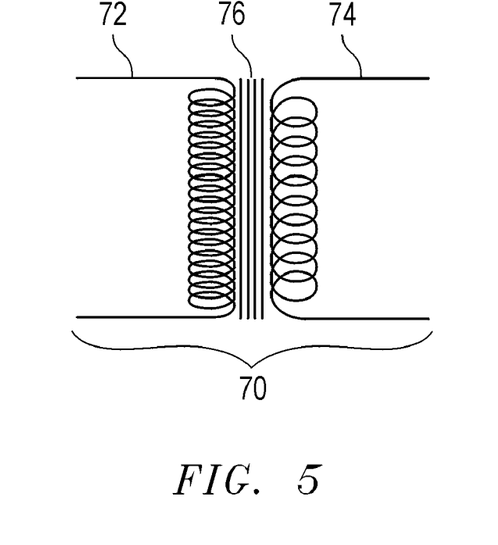
FIG. 5 illustrates superconducting articles utilized in a transformer according to one embodiment.
Figure 6:
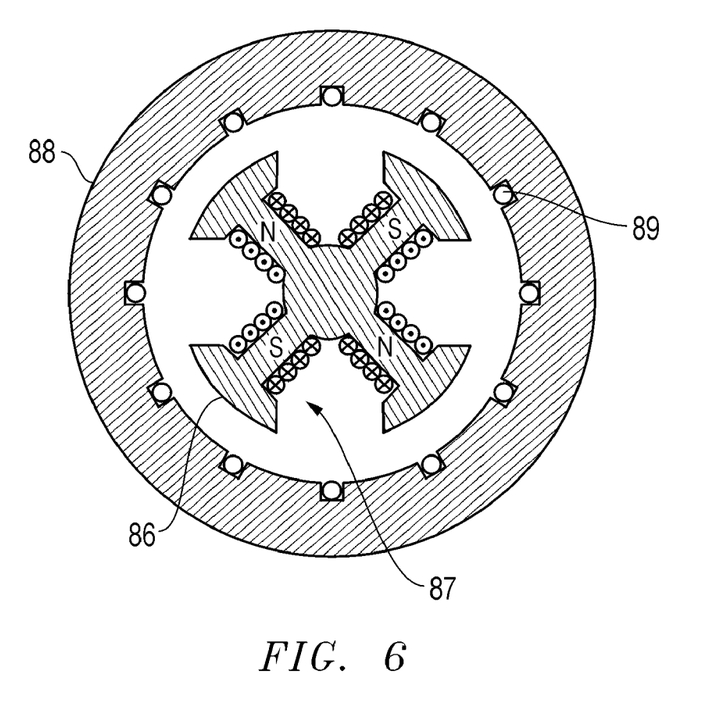
FIG. 6 illustrates superconducting articles utilized in a generator according to one embodiment.

FIG. 5 illustrates schematically a power transformer having a central core 76 around which a primary winding 72 and a secondary winding 74 are provided. It is noted that FIG. 5 is schematic in nature, and the actual geometric configuration of the transformer may vary as is well understood in the art. However, the transformer includes at least the basic primary and secondary windings. In this regard, in the embodiment shown in FIG. 5, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive conductors in accordance with the foregoing description Turning to FIG. 6, the basic structure of a generator is provided. The generator includes a rotor 86 that is driven as is known in the art, such as by a turbine. Rotor 86 includes high-intensity electromagnets, which are formed of rotor coils 87 that form the desired electromagnetic field for power generation. The generation of the electromagnetic field generates power in the stator 88, which comprises at least one conductive winding 89. According to a particular feature of the embodiment, the rotor coils and/or the stator winding comprises a superconductive conductor in accordance with embodiments described above. Low loss superconductors used in the stator windings generally substantially reduce hysteresis losses.

Figure 7:
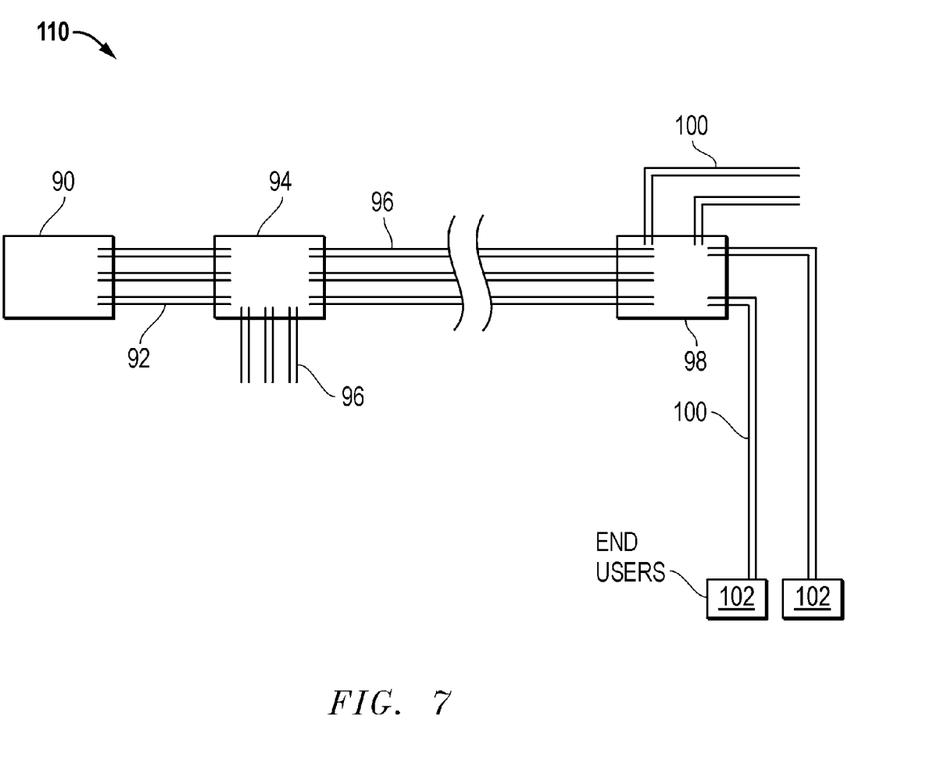
FIG. 7 illustrate superconducting articles utilized in a power grid according to one embodiment.

Turning to FIG. 7, a basic schematic of a power grid is provided. Fundamentally, the power grid 110 includes a power plant 90 typically housing a plurality of power generators. The power plant 90 is electrically connected and typically co-located with a transmission substation 94. The transmission substation contains generally a bank of step-up power transformers, which are utilized to step-up voltage of the generated power. Typically, power is generated at a voltage level on the order of thousands of volts, and the transmission substation functions to step-up voltages are on the order of 100,000 to 1,000,000 volts in order to reduce line losses. Typical transmission distances are on the order of 50 to 1,000 miles, and power is carried along those distances by power transmission cables 96. The power transmission cables 96 are routed to a plurality of power substations 98 (only one shown in FIG. 10). The power substations contain generally a bank of step-down power transformers, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 100 to end users 102, which include commercial end users as well as residential end users. It is also noted that individual transformers may be locally provided for individual or groups of end users. According to a particular feature, at least one of the generators provided in the power plant 90, the transformers and the transmission substation, the power transmission cables, the transformers provided in the power substation, and the power distribution cables contain superconductive tapes in accordance with the present description.

According to embodiments described above, superconducting articles are provided that have notably improved processability, performance, and improved durability. In particular, present embodiments make use of particular substrate alloys in the context of IBAD-based superconducting conductors, a notable combination of features. Such a combination of features represents a notable departure from state of the art IBAD-based superconducting conductors that generally rely on complex nickel-based alloys such as Hastelloy or Inconel. It is noted that Ni-based alloy materials either (i) consisting of Ni, or (ii) containing limited alloying elements have been disclosed in the context of RABiT-based conductors. See for example, U.S. Pat. Nos. 5,964,966, 6,331,199, and 6,106,615. However, the amount of the alloying element is generally quite limited, about 15 wt % or less, in order to enable biaxial texturing of the substrate. In addition, the state of the art of RABiT-based technology teaches that greater amounts of alloying elements undesirably raise the annealing temperature necessary to achieve a suitable biaxial texture. Additionally, the relatively lower amount of alloying element in the RABiT-based technology results in articles with less than desired yield strength, resistivity, and magnetic properties.

In contrast, the present inventors have discovered that particular alloy compositions as described above in the context of IBAD-based superconducting conductors provides noteworthy and heretofore unachieved improvements. For example, the present inventors have discovered that particular alloy compositions in IBAD-based superconducting conductors enable improved layer compositions and overall layering architectures. Notably, reduced diffusion of species between layers can in turn enable thinner or fewer layers within the superconductor architecture. The reduction of layers to process considerably increases the overall throughput of the manufacturing process. The present inventors have found reduced alloy element migration and contamination through the layered structure and accordingly a reduced need to excessively thick barrier films.

Still further, embodiments herein achieve increased resistance to delamination in the context of IBAD-based superconducting conductors. Such increased resistance can be attributed, at least in part, to the reduction of undesirable species within the substrate and without wishing to be tied to any particular theory, it has been observed by the inventors that a reduction in the presence of Mo in the substrate can result in reduction in vapor phase formation during processing of the superconducting conductor, which would otherwise cause delamination, wherein the functional superconducting layer is detached from the substrate.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A superconducting article comprising:
  a substrate, wherein the substrate is untextured and comprises a nickel-based alloy containing primarily nickel and not less than 20 wt % of an alloying element, wherein the substrate is essentially free of Mo and Mn, and wherein the substrate comprises a total amount of impurity materials of not greater than about 1.0 wt %, the impurity materials including Al, Co, Cu, P, Sb, Cd, As, Sn, and Si;
  a buffer layer overlying the substrate; and
  a high-temperature superconducting (HTS) layer overlying the buffer layer.

2. The superconducting article of claim 1, wherein the substrate has a surface roughness (Ra) of less than about 0.1 microns.

3. The superconducting article of claim 1, wherein the substrate is amorphous.

4. The superconducting article of claim 1, wherein the substrate is polycrystalline comprising grains having a random orientation.

5. The superconducting article of claim 1, wherein the substrate comprises less than about 2.0 wt % of Fe.

6. A superconducting article comprising:
a substrate, wherein the substrate is untextured and comprises a nickel-based alloy containing primarily nickel and not less than 25 wt % of the alloying element, wherein the substrate is essentially free of Mo and Mn, and wherein the substrate comprises a total amount of impurity materials of not greater than about 1.0 wt %, the impurity materials including Al, Co, Cu, P, Sb, Cd, As, Sn, and Si;
a buffer layer overlying the substrate; and
a high-temperature superconducting (HTS) layer overlying the buffer layer.

7. The superconducting article of claim 1, wherein the alloying element is selected from the group of elements consisting of W, Cr, and V.

8. The superconducting article of claim 7, wherein the alloying element is Cr.

9. The superconducting article of claim 1, wherein the substrate comprises not greater than about 4 elements.

10. The superconducting article of claim 1, wherein the substrate material has an average modulus of elasticity of not less than about $28 \times 10^6$ psi.

11. The superconducting article of claim 1, wherein the substrate has a dimension ratio of not less than $10^3$.

12. The superconducting article of claim 1, wherein the buffer layer comprises at least one material from the group consisting of $Al_2O_3$, $LaMnO_3$, $La_2Zr_2O_7$, $Gd_2Zr_2O_2$, MgO, NiO, YSZ, $CeO_2$, $Y_2O_3$, $Mn_3O_4$, $Fe_3O_4$, $Cu_2O$, and $RE_2O_3$, wherein RE is a rare earth element.

13. The superconducting article of claim 1, wherein the buffer layer comprises at least one biaxially textured film having biaxially aligned crystals both in-plane and out-of plane of the film.

14. The superconducting article of claim 13, wherein the biaxially textured film is overlying and in direct contact with the substrate.

15. The superconducting article of claim 1, wherein the buffer layer comprises a barrier film overlying and in direct contact with the substrate.

16. The superconducting article of claim 15, wherein the barrier film has an average thickness of not greater than about 0.2 microns.

17. The superconducting article of claim 15, wherein the barrier film is untextured.

18. The superconducting article of claim 17, wherein the barrier film is amorphous.

19. The superconducting article of claim 17, wherein the barrier film is polycrystalline comprising grains having a random orientation.

20. The superconducting article of claim 15, wherein the barrier film comprises an oxide material.

21. The superconducting article of claim 1, wherein the superconducting layer comprises a high-temperature superconductor material, having a critical temperature $T_c$ not less than about 77 K.

22. The superconducting article of claim 21, wherein the superconducting material comprises $REBa_2Cu_3O_{7-x}$, wherein RE is a rare earth element.

23. The superconducting article of claim 1, wherein a stabilizing layer overlies the HTS layer.

24. A superconducting article comprising:
an untextured substrate that is (i) amorphous, or (ii) polycrystalline comprising grains having a random orientation, wherein the substrate comprises a nickel-based alloy containing primarily nickel and not less than 20 wt % of an alloying element, wherein the alloying element is selected from the group of elements consisting of W, Cr, and V, and wherein the substrate is essentially free of Mo and Mn, and wherein the substrate comprises a total amount of impurity materials of not greater than about 1.0 wt %, the impurity materials including Al, Co, Cu, P, Sb, Cd, As, Sn, and Si;
a buffer layer overlying the substrate, the buffer layer comprising at least one biaxially textured film having biaxially aligned crystals both in-plane and out-of plane of the film; and
a high-temperature superconducting (HTS) layer overlying the buffer layer.

* * * * *